Feb. 8, 1966 G. H. DUMAS 3,234,437

ENCLOSED SEMI-CONDUCTOR DEVICE

Filed April 25, 1961

United States Patent Office 3,234,437

Patented Feb. 8, 1966

3,234,437
ENCLOSED SEMI-CONDUCTOR DEVICE
Guy H. Dumas, Paris, France, assignor to Societe Industrielle de Liaisons Electriques, a company of France
Filed Apr. 25, 1961, Ser. No. 105,418
Claims priority, application France, Apr. 29, 1960, 825,725
4 Claims. (Cl. 317—234)

This invention relates to improved semi-conductor devices especially suitable for use as rectifier diodes and the like.

Conventional semi-conductor diodes are usually constructed in more or less tubular form with the semi-conductor element, such as a silicon or germanium crystal, being connected with one terminal of the device by way of a conductor wire soldered at its opposite ends to an electrode of the crystal and to the terminal. Since such semi-conductor devices are prone to heat considerably in operation especially under high current loads, means have to be provided for adequate heat dissipation from the interior of the device to the surrounding atmosphere. For this purpose, conventional diodes when of relatively high power rating usually include at least one electrode which is provided with a large heat capacity and is preferably directly bonded to the semi-conductor element to provide for the desired heat dissipation to the outer space. The resulting diode construction is somewhat complicated and unwieldly, assembling operations are tedious, and the resulting assembly is of an inconvenient shape which, in particular, does not readily lend itself to a stacking of a number of such diode devices for electrical interconnection thereof into a series rectifier circuit.

Objects of this invention are to provide an improved construction of semi-conductor devices especially suitable for use as rectifier diodes, in which manufacturing and assembling operations will be considerably simplified and their cost reduced; in which all internal wire conductors are eliminated; in which heat dissipating characteristics in use will be improved with corresponding improvement in the performance of the device; which will be of an especially convenient form, specifically that of a flat-faced disc, permitting a number of similar such devices to be assembled into a stack and thereby simultaneously interconnected into a series circuit to provide a high-voltage rectifier or the like. Other objects will appear.

The invention provides a semi-conductor device which comprises a pair of parallel spaced flanges of electrically conductive material, an annular spacer member of insulating material positioned between said flanges and having its opposite sides bonded to peripheral areas of the respective flanges, and a semi-conductor element between the flanges within the annular spacer member and having opposite sides engaging central areas of the respective flanges.

In a preferred form the flanges are circular and have depressed central areas defining bosses projecting from each flange toward the other flange and the semi-conductor element is retained between the flat surfaces of said bosses in engagement therewith and preferably bonded thereto with solder or the like.

Such a diode assembly has excellent characteristics of heat dissipation since the heat dissipated in the semi-conductor element is rapidly discharged through both relatively large area flanges in direct contact engagement therewith. All internal conductor wires are eliminated since the semi-conductor element, such as a flat wafer, is in direct surface engagement with the central areas of both flanges. Assembly procedure is facilitated. In use, a plurality of the devices can be conveniently stacked.

An exemplary embodiment of the invention will now be described for purposes of illustration but not of limitation with reference to the accompanying drawings, wherein.

Figure 2:
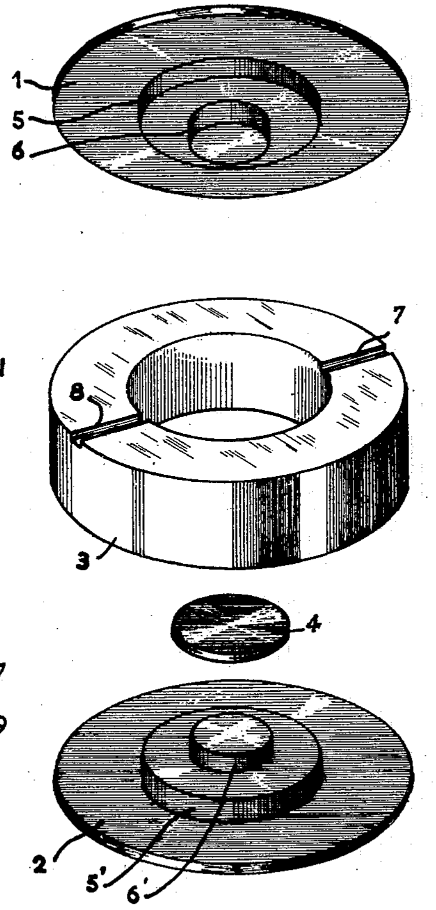
FIG. 2 is an exploded view of the components of the device on an enlarged scale.
Figure 1:
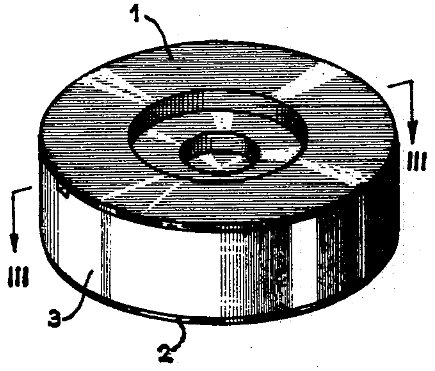
FIG. 1 is a perspective view of a completed diode according to an embodiment of the invention.

As shown in the drawings, a semi-conductor diode device according to the invention comprises a symmetrical pair of similar side flanges 1 and 2 and an intermediate annular spacer member 3, with a semi-conductor wafer 4 being positioned in the central recess of the annular spacer member and bonded to the central portions of flanges 1 and 2.

Figure 3:
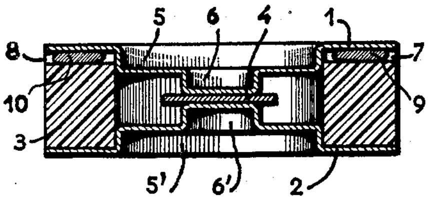
FIG. 3 is a view of the device in axial cross section.

The flanges 1 and 2 may comprise swaged elements of sheet copper of about 0.5 mm. thickness. To improve electric contact and facilitate subsequent brazing the flanges are preferably coated with a thin film of high-purity gold. The flanges, as clearly shown in FIG. 2 or 3, are each formed with two stepped, concentric depressions including a larger diameter depression 5 followed by a smaller diameter depression 6 providing a central hub or boss on each flange. A suitable set of dimensions for the flanges may be as follows: outer diameter 20 mm.; diameter of larger depression 5.10 mm.; diameter of inner depression 6, about 3 mm. The total depth of the flange may be about 3 mm.

The semi-conductor wafer may comprise a silicon crystal about 0.2 mm. thick and 3.5 to 4 mm. outer diameter.

The spacer member is made from a suitable dielectric material such as ceramic and may conveniently comprise a section of a tube having an outer diameter of about 20 mm. equal to that of the flanges and an inner diameter somewhat greater than 10 mm. so as to permit an easy interengagement of the depressions 5 of flanges 1 and 2 therewith. The spacer member 3 may have metal plated end surfaces to facilitate brazing. The brazing or solder material used may comprise a lead alloy both for bonding the flanges 1 and 2 to spacer 3 and for bonding the flanges to the semi-conductor wafer 4.

The annular spacer member 3 is formed with a pair of aligned radial grooves 7 and 8 which may be about 1.5 mm. wide and 1 mm. deep, to provide communication from the interior of the complete semi-conductor device to the exterior. The grooves or ducts 7 and 8 thus provide a means of controlling the internal gas medium in the device during assembly and soldering operations. After these operations have been completed, the ducts 7 and 8 are sealed to protect the semi-conductor wafer 4 permanently from the outer atmosphere.

As a modification, a groove may be formed in flange 1 and/or 2 during the swaging or stamping thereof, or an orifice may be punched in one at least of the flanges and subsequently sealed after completion of the assembly. The sealing means may comprise a substance polymerizable by heat. To construct such a semi-conductor device, the component parts of it, as described above, are placed upon a heat resistant flat supporting surface such as a stainless steel surface able to withstand the heat applied during the subsequent soldering operation, the components being stacked in their proper order as shown in FIG. 2. Before proceeding to assemble the components, the surfaces thereof that are to be bonded together are first coated with a fusible solder material; then the mating surfaces are brought into engagement, and the assembly is heated to a sufficiently high temperature for soldering said surfaces together, and then allowed to cool.

If desired, instead of coating the surfaces with layers of solder material, the solder material may be applied in the form of discs punched from a suitable solder alloy such as lead alloy about 0.4 mm. thick. In such case the soldering step may involve oven-heating at about 350° C. A vacuum may be maintained in the oven during the heating step and throughout cooling, or if preferred an inert gas atmosphere such as nitrogen may be used. In one desirable procedure, both measures may be combined as by first evacuating the oven and then delivering the inert gas, e.g. nitrogen, into it, thereby effectively displacing any traces of air with the inert gas.

Normally, when proceeding as described, it is found unnecessary to apply pressure to the components of the device during assembly since it is found that provided the components have been satisfactorily shaped and machined, gravity provides sufficient pressure to ensure correct assembly.

If desired to provide a vacuum or a compatible or inert atmosphere within the completed semi-conductor device, the assembly is allowed to cool under the control atmosphere applied into it through the grooves such as 7 and 8 (or other passage means as described earlier), and the grooves are then sealed by plugs such as 9 and 10 e.g. with a silicone base composition such as that sold by the trade name "Silastene," or a suitable polymerizable elastomer which may be polymerized after it has been positioned in the grooves 7–8 by heating the assembly in an oven at suitable temperature and for a suitable time to ensure the desired polymerization. Where Silastene is used, a short-term heating at 80° C. is sufficient for this purpose. On cooling the semi-conductor device is complete and ready for use.

In use a semi-conductor device constructed as described is found to have excellent cooling characteristics. By way of indication, a diode device having the characteristics specified hereinabove has been used to rectify alternating current of 12 amperes under 600 volts. When operating under full power of 10 watts, all of this power is effectively dissipated as heat by the surfaces of flanges 1 and 2 exclusively, the electric connections with the diode device may be effected simply by pressure of external contact elements with the opposite flat surfaces of the flanges 1 and 2.

A plurality of diode devices of the type just described can conveniently be stacked to provide a resultant rectifier device capable of handling voltages higher than the nominal voltage rating of each device such as 600 volts. Any suitable means may be provided for clamping the devices of the stack to retain them in assembly. It will be apparent that semi-conductor devices of the type described are especially well-suited for mass production at very low cost.

It will be understood that various changes and modifications may be made in the single embodiment of the invention illustrated and described without exceeding the scope of the invention. Thus, the shape of the side flanges may differ from that shown, nor is the shape of both flanges necessarily the same although this does have the advantage of reducing the number of different-shape components required and hence reducing production costs. If desired however the two flanges may differ in shape and this can serve to distinguish between the two opposite polarities of the diode. The invention may, furthermore, be applicable to semi-conductor devices other than rectifier diodes.

What is claimed is:

1. An enclosed semi-conductor device comprising a pair of parallel spaced generally circular flanges of electrically conductive material, a first circular depression in each flange defining an annular shoulder projecting toward the other flange, a second and smaller-diameter circular depression in each flange defining a central flat-topped boss projecting toward the other boss, an annular insulator member positioned between and secured to the flanges and having its inner periphery seated around said annular shoulders of the respective flanges and having its opposite annular surfaces bonded to peripheral areas of the respective flanges, and a flat semi-conductor wafer retained between said generally flat-topped bosses in engagement therewith.

2. An enclosed semi-conductor device comprising two electrodes, each having at least three stepped concentric disc portions, the innermost disc portions forming opposed central flat circular bottom walls and the outermost disc portions forming opposed radial outer flanges, a semi-conductor element having two opposite contact faces, one of said faces engaging the bottom wall of one electrode and the other of said faces engaging the bottom wall of the other electrode, said outer most disc portions of both electrodes defining two concentric annular spaces around said element, and a ring of insulating material disposed in the outermost of said annular spaces and being secured to the opposed radial outer flanges.

3. An enclosed semi-conductor device according to claim 2 in which the diameter of the outer disc portion of each electrode is slightly smaller than the inner diameter of said insulating ring.

4. An enclosed semi-conductor device according to claim 2 wherein said insulating material is bonded to the outer radial flanges by a fusible alloy, said fusible alloy being an alloy of lead.

References Cited by the Examiner

UNITED STATES PATENTS

| | | | |
|---|---|---|---|
| 2,423,091 | 7/1947 | Fiore | 317—234 |
| 2,738,452 | 3/1956 | Martin | 317—234 |
| 2,745,044 | 5/1956 | Lingel | 317—234 |
| 2,756,374 | 7/1956 | Colleran et al. | 317—235 |
| 3,017,550 | 1/1962 | Dickson | 317—234 |
| 3,023,346 | 2/1962 | Wagner | 317—234 |

FOREIGN PATENTS

| | | |
|---|---|---|
| 1,038,428 | 9/1953 | France. |

GEORGE N. WESTBY, *Primary Examiner.*

J. D. KALLAM, *Assistant Examiner.*